(12) United States Patent
Lin et al.

(10) Patent No.: US 11,152,295 B2
(45) Date of Patent: Oct. 19, 2021

(54) SEMICONDUCTOR PACKAGE STRUCTURE AND METHOD FOR MANUFACTURING THE SAME

(71) Applicant: TAIWAN SEMICONDUCTOR MANUFACTURING COMPANY LTD., Hsinchu (TW)

(72) Inventors: Chih-Hao Lin, Hsinchu (TW); Chien-Kuo Chang, Hsinchu County (TW); Tzu-Kai Lan, Yilan County (TW); Hui-Ting Lin, Tainan (TW); Chun-Min Lin, Hsinchu (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 576 days.

(21) Appl. No.: 15/952,713

(22) Filed: Apr. 13, 2018

(65) Prior Publication Data
US 2019/0318987 A1 Oct. 17, 2019

(51) Int. Cl.
*H01L 23/495* (2006.01)
*H01L 23/498* (2006.01)
*H01L 23/31* (2006.01)
*H01L 23/00* (2006.01)

(52) U.S. Cl.
CPC .... *H01L 23/49838* (2013.01); *H01L 23/3157* (2013.01); *H01L 23/49811* (2013.01); *H01L 23/49894* (2013.01); *H01L 24/16* (2013.01); *H01L 24/81* (2013.01); *H01L 2224/16227* (2013.01); *H01L 2224/81022* (2013.01); *H01L 2224/81024* (2013.01); *H01L 2224/81815* (2013.01)

(58) Field of Classification Search
CPC ............... H01L 21/3157; H01L 21/563; H01L 23/49838; H01L 23/3157; H01L 23/49811; H01L 23/49894
See application file for complete search history.

(56) References Cited

U.S. PATENT DOCUMENTS

| | | |
|---|---|---|
| 8,802,504 B1 | 8/2014 | Hou et al. |
| 8,803,292 B2 | 8/2014 | Chen et al. |
| 8,803,316 B2 | 8/2014 | Lin et al. |
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,496,189 B2 | 11/2016 | Yu et al. |

(Continued)

*Primary Examiner* — Phuc T Dang
(74) *Attorney, Agent, or Firm* — WPAT, P.C.; Anthony King

(57) ABSTRACT

A semiconductor package structure includes a first package including a bonding region and a periphery region surrounding the bonding region, at least one insulating structure disposed in the bonding region of the first package, a second package disposed over the first package and the insulating structure in the bonding region, and a plurality of connectors disposed between the first package and the second package. The plurality of connectors provide electrical connection between the first package and the second package. Further, the insulating structure penetrates the first package and is spaced apart from the plurality of connectors.

20 Claims, 14 Drawing Sheets

(56) References Cited

U.S. PATENT DOCUMENTS

| | | | |
|---|---|---|---|
| 2003/0042035 A1* | 3/2003 | Myers | H01L 21/563 174/558 |
| 2003/0113952 A1* | 6/2003 | Sambasivam | H01L 21/563 438/108 |
| 2009/0194322 A1* | 8/2009 | Usui | H05K 1/115 174/260 |

* cited by examiner

SEMICONDUCTOR PACKAGE STRUCTURE AND METHOD FOR MANUFACTURING THE SAME

BACKGROUND

The semiconductor integrated circuit (IC) industry has experienced rapid growth. Technological advances in IC materials and design have produced generations of ICs where each generation of ICs includes smaller and more complex circuits than those of the previous generation. The smaller and more complex circuits are two-dimensional (2D) in nature, in that the area occupied by the integrated IC's components is on the surface of the semiconductor wafer. However, 2D IC formation faces physical limits. One of these limits is the minimum area needed to accommodate the integrated components. In addition, when more devices are included in one chip or die, more complex designs are required.

To enable further increases in circuit density, three-dimensional integrated circuits (3DIC) have been developed. In a typical 3DIC formation process, two chips are bonded together and electrical connections are formed between the chips. Bonding two chips may be accomplished by, for example, attaching one chip on top of the other, a process known as stacking. The stacked chips are then bonded to a carrier substrate and wire bonds electrically coupling the stacked chips and the carrier substrate may be formed. However, such approach requires a carrier substrate larger than the chips for the wire bonding. More recent attempts therefore have focused on flip-chip interconnections and the use of conductive balls or bumps to form a connection between the chips and the underlying substrate, thereby allowing high wiring density in a relatively small package.

Typically, chip stacking uses solder joints involving solder, flux and underfill. Processes for these elements incur issues related to limitations on pitch, joint height, and flux residue.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2 to 6 are schematic drawings illustrating a semiconductor package structure at various fabrication stages constructed according to aspects of one or more embodiments of the present disclosure, wherein

DETAILED DESCRIPTION

Figure 1:
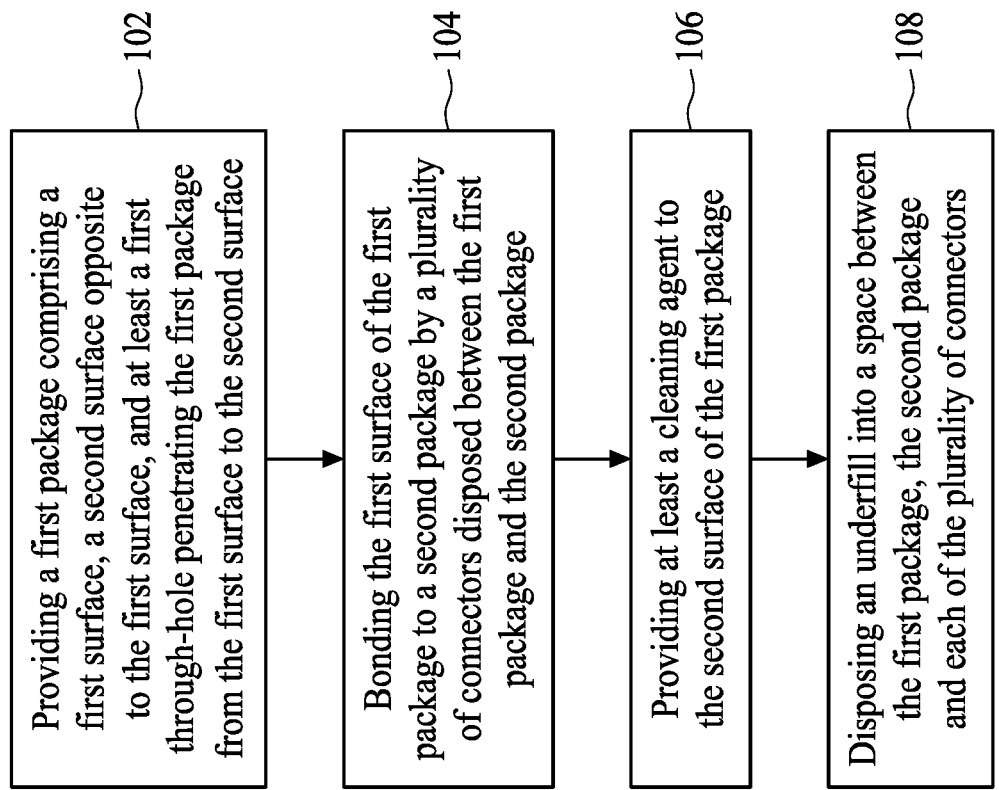
FIG. 1 is a flow chart representing a method for manufacturing a semiconductor package structure according to aspects of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±4%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±4%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±4°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to +4°, less than or equal to ±4°, less than or equal to ±2°, less than or equal to ±1°, less than or equal to ±0.5°, less than or equal to ±0.1°, or less than or equal to ±0.05°.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In 3DIC, a chip or a package carrying an integrated circuit is commonly mounted on a package carrier, such as a substrate or a circuit board, that provides electrical connections from the chip to the exterior of the package. In one such packaging arrangement called flip chip mounting, the semiconductor chip may be mounted to a bump pattern of contact pads formed on a semiconductor package substrate. In some embodiments, an operation sequence includes forming solder bumps on bonding pads or other signal connection devices on a semiconductor chip, applying flux to at least one of the package substrate and the semiconductor chip, and aligning the chip with the package substrate. The components are then joined during a reflow process. After the reflow process is performed, a deflux or flux cleaning operation is used to remove superfluous or unnecessary flux from the bonded package substrate and the chip, and an underfill is applied or dispensed between the chip and the package substrate after the flux cleaning operation.

The flux cleaning (or removal) operation includes providing cleaning solvent into the gap between the chip and the package substrate to clean away remnant flux, applying de-ionized (DI) water, heating, and drying. In some embodiments, the cleaning solvent and the DI water are sprayed from a chip side of the bonded structure and are allowed to enter the gap between the chip and the package substrate slowly by capillarity. In some embodiments, when the bump pitch is reduced to less than 180 μm or the chip size is increased to larger than 20 mm by 30 mm, the capillarity is reduced and thus the flux in at least a central region of the package may not be removed. The flux residue in such cases causes the subsequently formed underfill to have voids. Voids in the underfill can result in unfavorable thermal stress distribution during thermal cycling of the package, leading to solder connection failure and underfill delamination, and therefore degrade the quality and reliability of the bonded package structure. Additionally, the flux residue may form short circuits after reflow and thus further reduces the reliability of the bonded package structure.

In some embodiments, when the package substrate size is larger than 20 mm by 30 mm, the package product further suffers from warpage, and thus a bridge between the humps and/or a cold joint between the bump and the pad may be formed.

The present disclosure therefore provides a semiconductor structure including a package having at least one through-hole that allows cleaning solvent to be directly injected into the space between the bonded structures. Therefore, flux removal efficiency may be improved and flux residue is reduced. Further, the through-hole can mitigate package warpage. Accordingly, the underfill delamination, underfill void, bump bridge, and cold joint issues are all mitigated.

FIG. 1 is a flow chart representing a method for manufacturing a semiconductor package structure 10 according to aspects of the present disclosure. The method for manufacturing the semiconductor package structure 10 includes an operation 102, providing a first package. In some embodiments, the first package includes a first surface, a second surface opposite to the first surface, and at least a first through-hole penetrating the first package from the first surface to the second surface. The method 10 further includes an operation 104, bonding the first surface of the first package to a second package by a plurality of connectors disposed between the first package and the second package. In some embodiments, the second package is bonded to the first surface of the first package. The method 10 further includes an operation 106, providing at least a cleaning agent to the second surface of the first package. It should be noted that the cleaning agent is injected into a space between the first package, the second package and each of the plurality of connectors through the first through-hole. The method 10 further includes an operation 108, disposing an underfill into a space between the first package, the second package and each of the plurality of connectors. The method 10 will be further described according to one or more embodiments. It should be noted that the operations of the method 10 may be rearranged or otherwise modified within the scope of the various aspects. It should further be noted that additional processes may be provided before, during, and after the method 10, and that some other processes may only be briefly described herein. Thus, other implementations are possible within the scope of the various aspects described herein.

Figure 2:
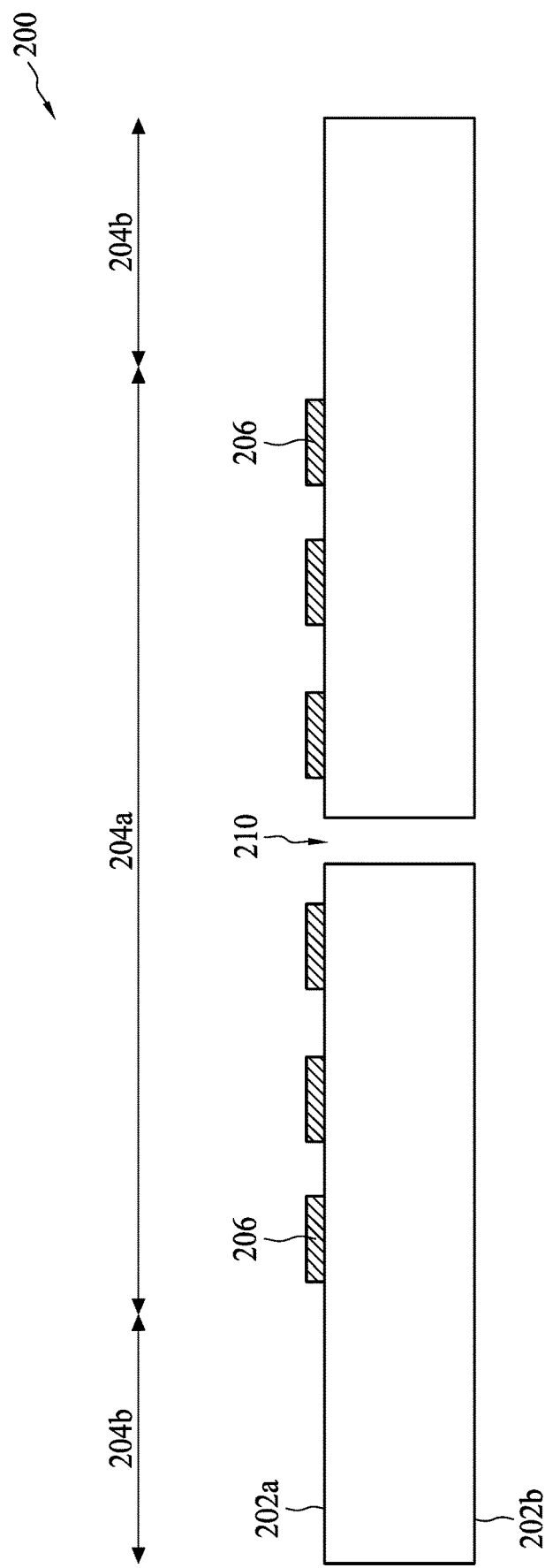

FIGS. 2 to 6 are schematic drawings illustrating a semiconductor package structure 20 at various fabrication stages constructed according to aspects of one or more embodiments of the present disclosure. Please refer to FIGS. 2, 3A and 3B, wherein FIG. 2 is a cross-sectional view taken along line A-A' of FIG. 3A or FIG. 3B. According to operation 102, a first package 200 is provided. In some embodiments, the first package 200 can include a carrier or a substrate of one or more packages. The first package 200 includes a first surface 202a and a second surface 202b opposite to the first surface 202a. In some embodiments, the first package 200 includes at least a bonding region 204a and a periphery region 204b defined over the first surface 202a. The bonding region 204a is a region defined and configured for bonding one or more packages or chips. Accordingly, in the depicted embodiment, a size of the bonding region 204a is approximately equal to a size of the package to be bonded. The bonding region 204a of the first package 200 may include a plurality of first bonding pads 206 disposed over the first surface 202a for bonding with the package. The periphery region 204b of the first package 200 is a region that is not configured for bonding to the package. In some embodiments, the periphery region 204b surrounds the bonding region 204b, as shown in FIGS. 2, 3A and 3B, but the disclosure is not limited thereto.

Figure 3B:
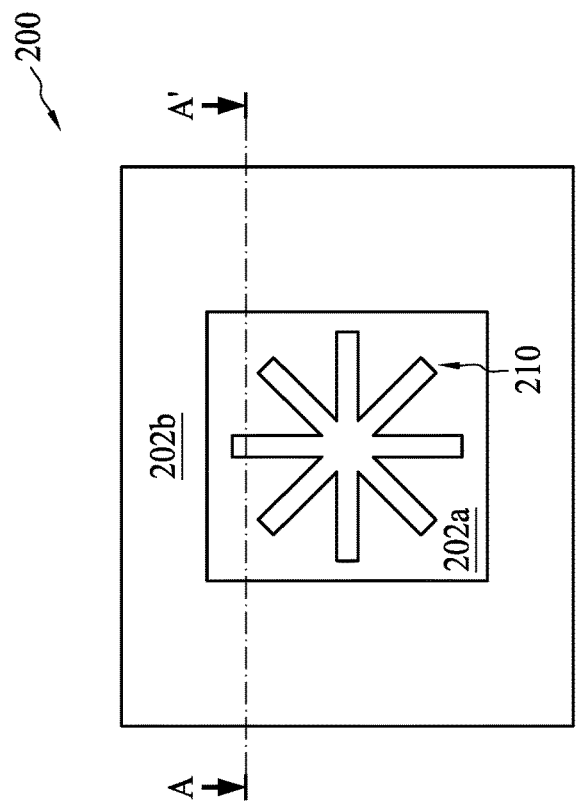
FIGS. 3A and 3B are schematic top views of the first package of the semiconductor package structure according to aspects of one or more embodiments of the present disclosure.
Figure 3A:
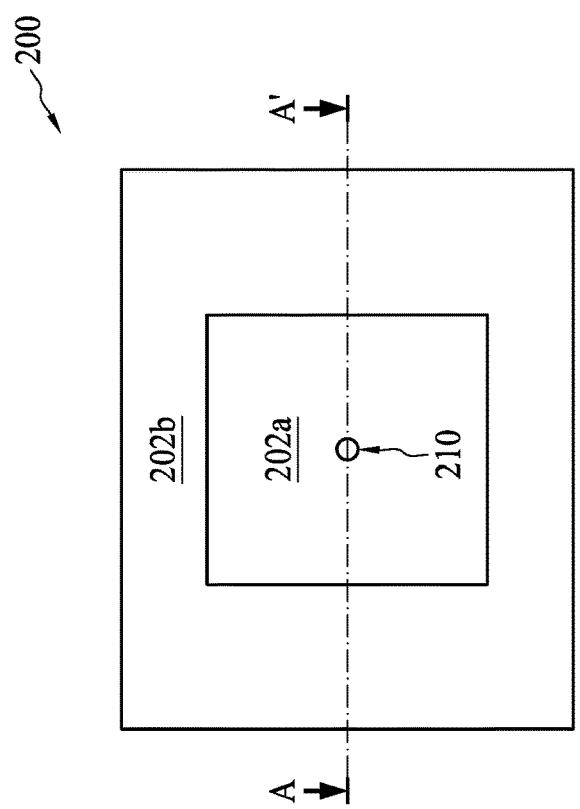

In some embodiments, the first package 200 is a laminate substrate. The laminate substrate may be a plastic substrate or a ceramic substrate. Alternatively, the substrate may be a build-up substrate. Notably, the first package 200 includes at least one through-hole 210 formed in the bonding region 204a, and the through-hole 210 penetrates the first package 200 from the first surface 202a to the second surface 202b, as shown in FIG. 2. In some embodiments, the through-hole 210 includes a circular shape from a top view, as shown in FIG. 3A. In some embodiments, the through-hole 210 includes a radiating pattern from a top view, as shown in FIG. 3B. However, as those skilled the art can easily realize that other shapes or patterns can be adopted to meet the process requirement. Notably, the through-hole 210 is spaced apart from the first bonding pads 206, as shown in FIG. 2.

Figure 4:
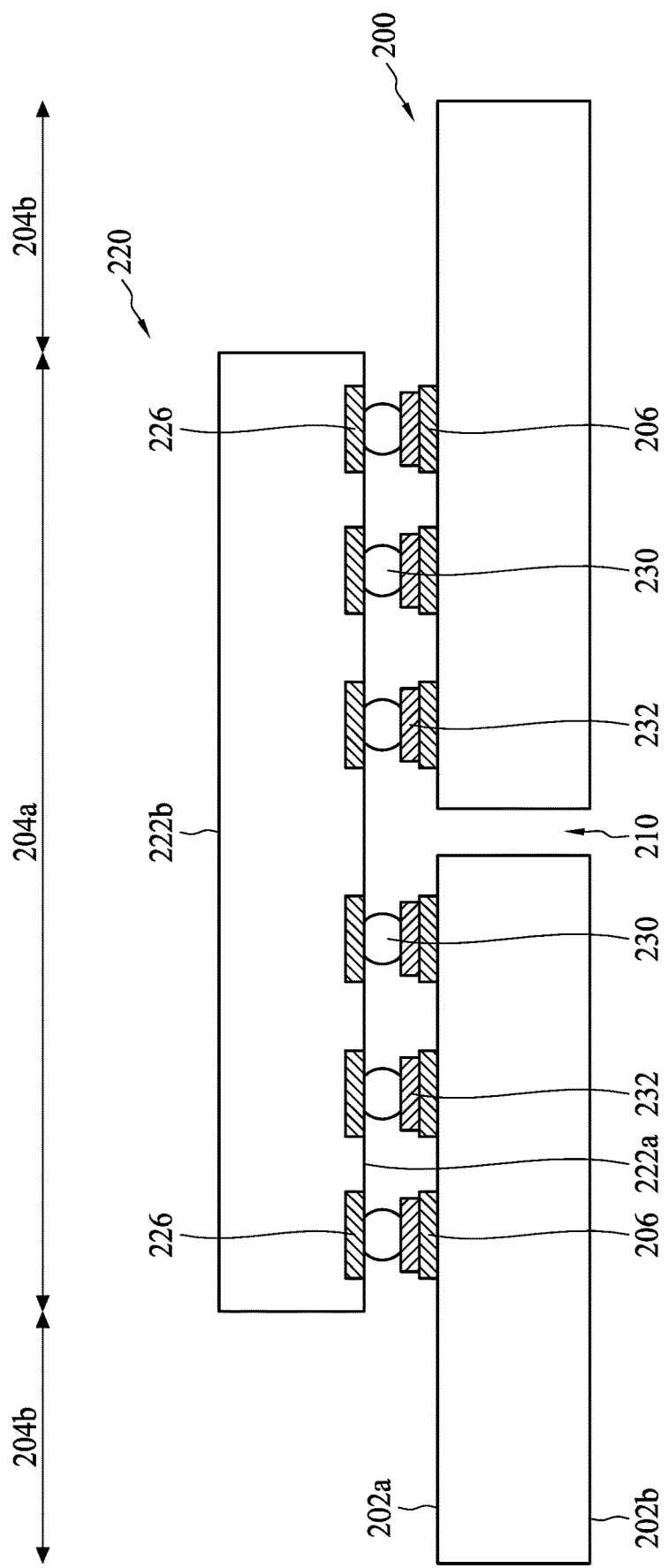

Referring to FIG. 4, a second package 220 is provided, and the first package 200 is bonded to the second package 220 by a plurality of connectors 230, according to operation 104. In some embodiments, the second package 220 can be a chip (which is sometimes referred to as a die). The chip may be an integrated circuit (IC) chip, a system on chip (SoC), or a portion thereof, and may include various passive and active microelectronic devices such as resistors, capacitors, inductors, diodes, metal-oxide-semiconductor field effect transistors (MOSFETs), complementary metal-oxide-semiconductor (CMOS) devices, bipolar junction transistors (BJTs), laterally diffused MOS (LDMOS) transistors, high power MOS transistors, or other types of transistors. The chip may include a microelectromechanical system (MEMS) device and/or a nanoelectromechanical system (NEMS) device. In some embodiments, the second package 220 includes the chip, and the chip includes a wafer (not shown). The wafer may be, for example but not limited thereto, a silicon (Si) wafer. The wafer may alternatively be made of some other suitable elementary semiconductor, such as diamond or germanium (Ge); a suitable compound semiconductor, such as silicon carbide (SiC), indium arsenide (InAs), or indium phosphide (InP); or a suitable alloy semiconductor, such as SiGeC, gallium arsenic phosphide (GaAsP), or GaInP. The wafer may include various doped regions (not shown), isolation structures (not shown), other devices, or a combination thereof.

In some embodiments, the second package 220 includes a first surface 222a and a second surface 222b opposite to the first surface 222a. The second package 220 can also have an interconnect structure (not shown) formed over the first surface 222a. The interconnect structure may include a plurality of patterned dielectric layers and conductive layers that provide interconnections between the various devices of the second package 220. The second package 220 further includes a plurality of second bonding pads 226 disposed over the first surface 222a of the second package 220, and the second bonding pads 226 may be electrically connected to the various devices of the second package 220 through the interconnect structure.

Still referring to FIG. 4, the first package 200 and the second package 220 are bonded through the connectors 230. In some embodiments, the second package 220 can be flipped upside down (vertically rotated 180 degrees), and bonded to the first package 200, Since the first surface 222a (an active surface in some embodiments) of the second package 220 is bonded to the first surface 202a of the first package 200, the second surface 222b of the second package 220 is visible in the top view of the semiconductor package structure 20. The second package 220 and the first package 200 are bonded by any suitable mechanism. For example, the connectors 230, such as solder balls (also referred to as solder bumps), are formed on the second bonding pads 226, respectively. The connectors 230 are then aligned with and brought into contact with the first bonding pads 206 over the first package 200, thereby producing electrical coupling between the first package 200 and the second package 220.

It is worth noting that a solder flux 232 is applied to at least one of the first package 200 and the second package 220. In some embodiments, the solder flux can be applied to the second bonding pads 226 of the second package 220. The connectors 230 are then picked up by a ball-mounting head (not shown) and placed on the solder flux 232. In some embodiments, the solder flux 232 can be applied to the first bonding pads 206 of the first package 200 and the connectors 230 while the second package 220 is aligned with the first bonding pads 206 for bonding. In some embodiments, the solder flux 232 may applied by, for example, brushing, spraying, stenciling, or other methods. The solder flux 232 can include an acidic component that creates a wettable surface for the connectors 230 by removing oxides and other contaminations from the metal to be joined and isolating the surface of the bonding pads 206 and/or 226 from the atmosphere. The solder flux 232 can also have an adhesive quality that helps to prevent movement and hold the second package 220 to the first package 200 during the operation. However, while some embodiments include use of the solder flux 232, other types of materials may also be utilized to aid the connection between the connectors 230 and the bonding pads 206 and/or 226. Any other suitable material, such as a solder paste, an adhesive, or the like, may be utilized. All such materials are intended to be included within the scope of the embodiments.

Still referring to FIG. 4, once the connectors 230 and the second bonding pads 226 are aligned with the first bonding pads 206, a ref ow may be performed, such that the connectors 230 physically and electrically bond the first package 200 to the second package 220. In some embodiments, the connectors 230 are reflowed by raising the temperature to higher than approximately 200° C., and hence the connectors 230 are melted. With the help of the solder flux 232, the connectors 230 are bonded on the first bonding pads 206 of the first package 200. Upon cooling, the connectors 230 form both the mechanical and electrical connections between the first package 200 and the second package 220.

Figure 5:
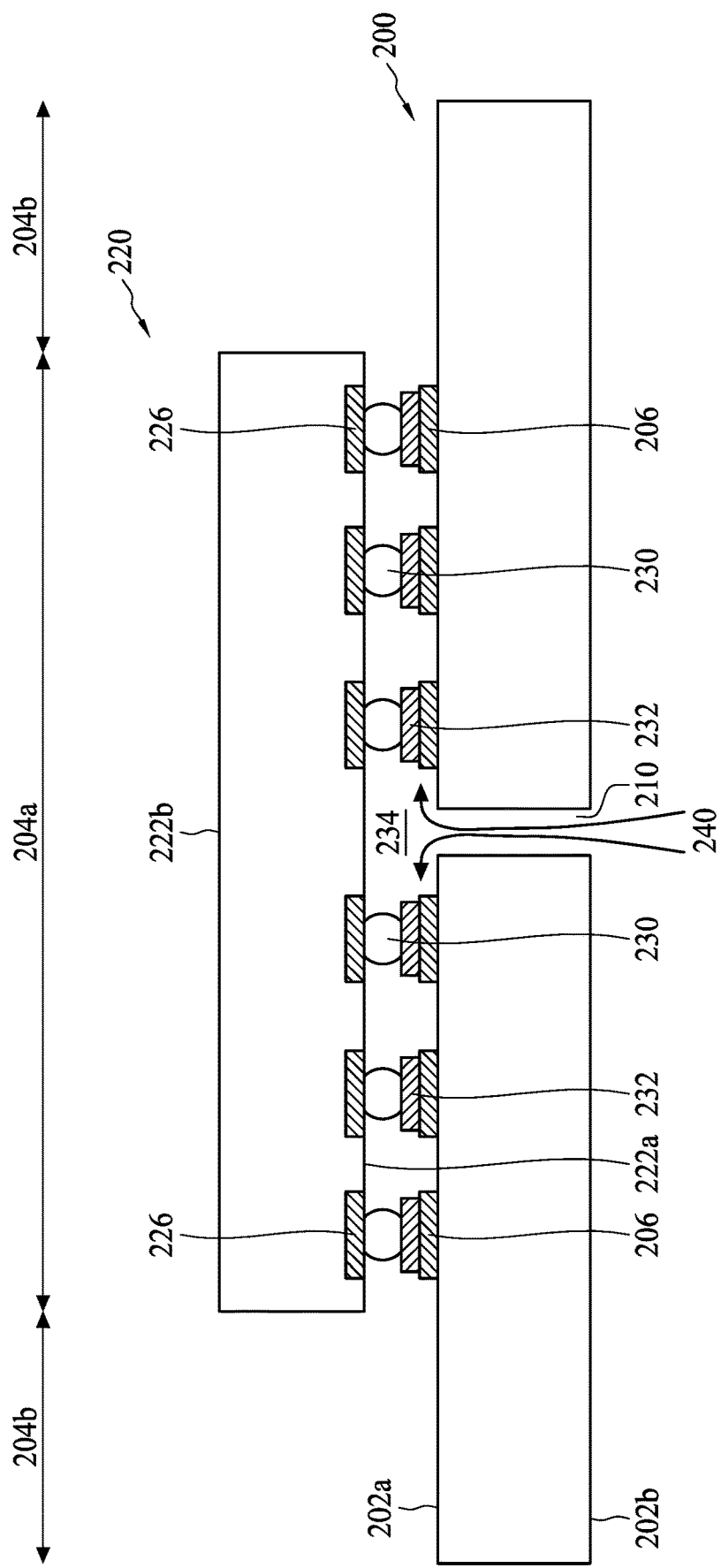

Referring to FIG. 5, a flux removal operation is then performed to remove superfluous flux or other material to aid the connection between the connectors 230 and the bonding pads 206 and/or 226. In some embodiments, at least a cleaning agent 240 is provided to the second surface 202b of the first package 200, according to operation 106. The cleaning agent 240 can include flux cleaning solvent and DI water. Notably, the cleaning agent 240 is provided, pressurized, and injected into a space 234 between the first surface 202a of the first package 200, the first surface 222a of the second package 220, and the connectors 230 through the through-hole 210, which can be located in a center of the bonding region 204a, as shown in FIG. 5. In some embodiments, the cleaning agent 240 is injected into the space 234 with jet wash, and removed with compressed air. The DI water is then injected into the space 234 with jet wash.

Subsequently, compressed air is injected into the space 234 to dry out all surfaces of the first package 200, the second package 220 and each of the connectors 230. Consequently, the cleaning agent 240 directly flushes superfluous flux away. It is worth noting that even if the bump pitch of the connectors 230 is reduced to less than 180 μm, the superfluous flux can be efficiently removed because the cleaning agent 240 is directly injected into the space 234 through the through-hole 210, instead of slowly flowing into the space 234 by capillarity. Additionally, in some embodiments, in which a size of the second package 220 is larger than 20 mm by 30 mm, the superfluous flux can still be efficiently removed because the cleaning agent 240 is directly injected into the space 234 through the through-hole 210, instead of slowly flowing into the space 234 by capillarity.

Figure 6:
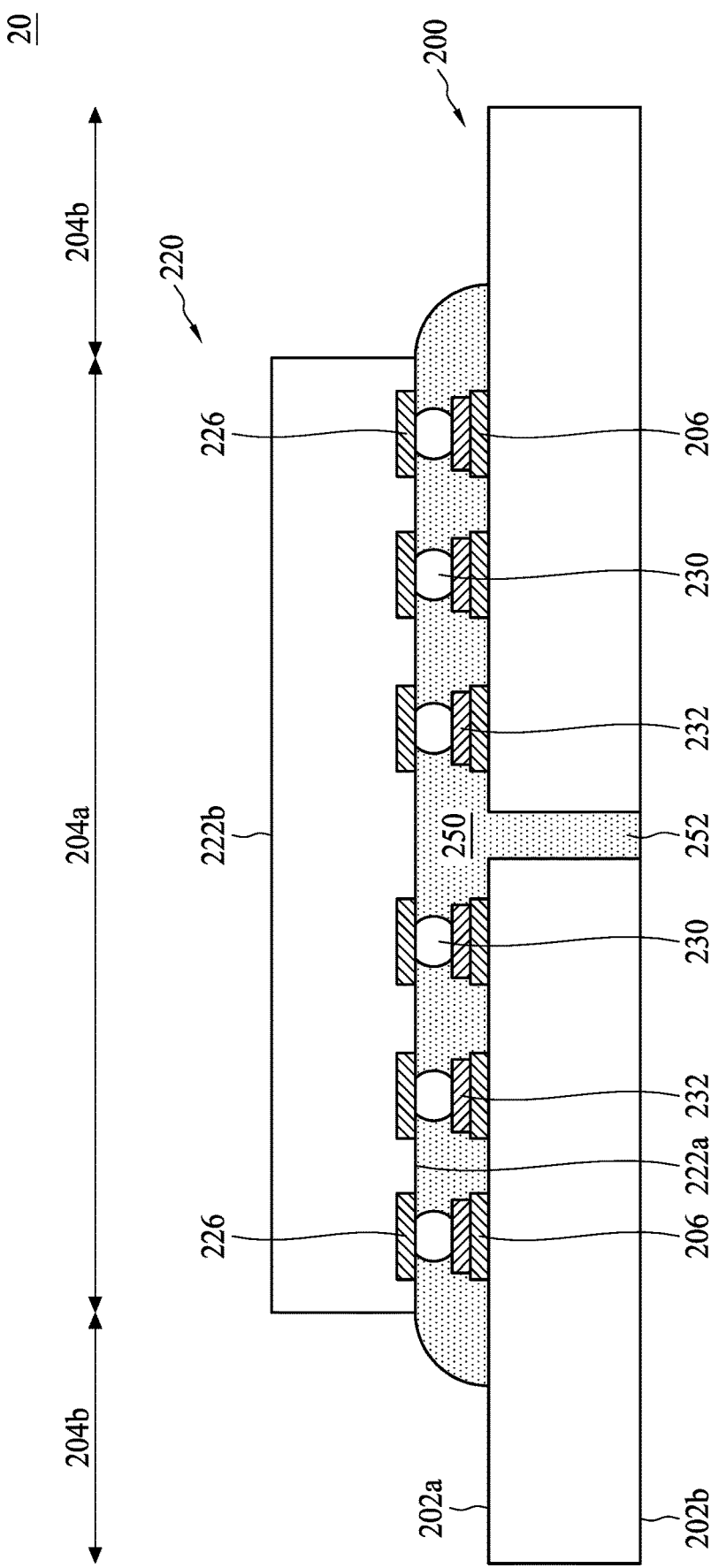

Referring to FIGS. 5 and 6, an underfill 250 is disposed into the space 234 between the first package 200, the second package 220 and each of the connectors 230, according to operation 108. The underfill 250 is injected into the space 234 in order to reduce stress exerted on the bonded structures after the bonding. In some embodiments, the underfill 250 fills the through-hole 210, thereby forming an insulating structure 252 in the first package 200. In other words, the underfill 250 and the insulating structure 252 include the same material. In some embodiments, the underfill 250 and the insulating structure 252 can include polymers such as resin epoxy, or other suitable materials. In some embodiments, the underfill 250 and the insulating structure 252 include fillers, such as silica, to adjust the mechanical strength of the underfill 250.

Figure 7:
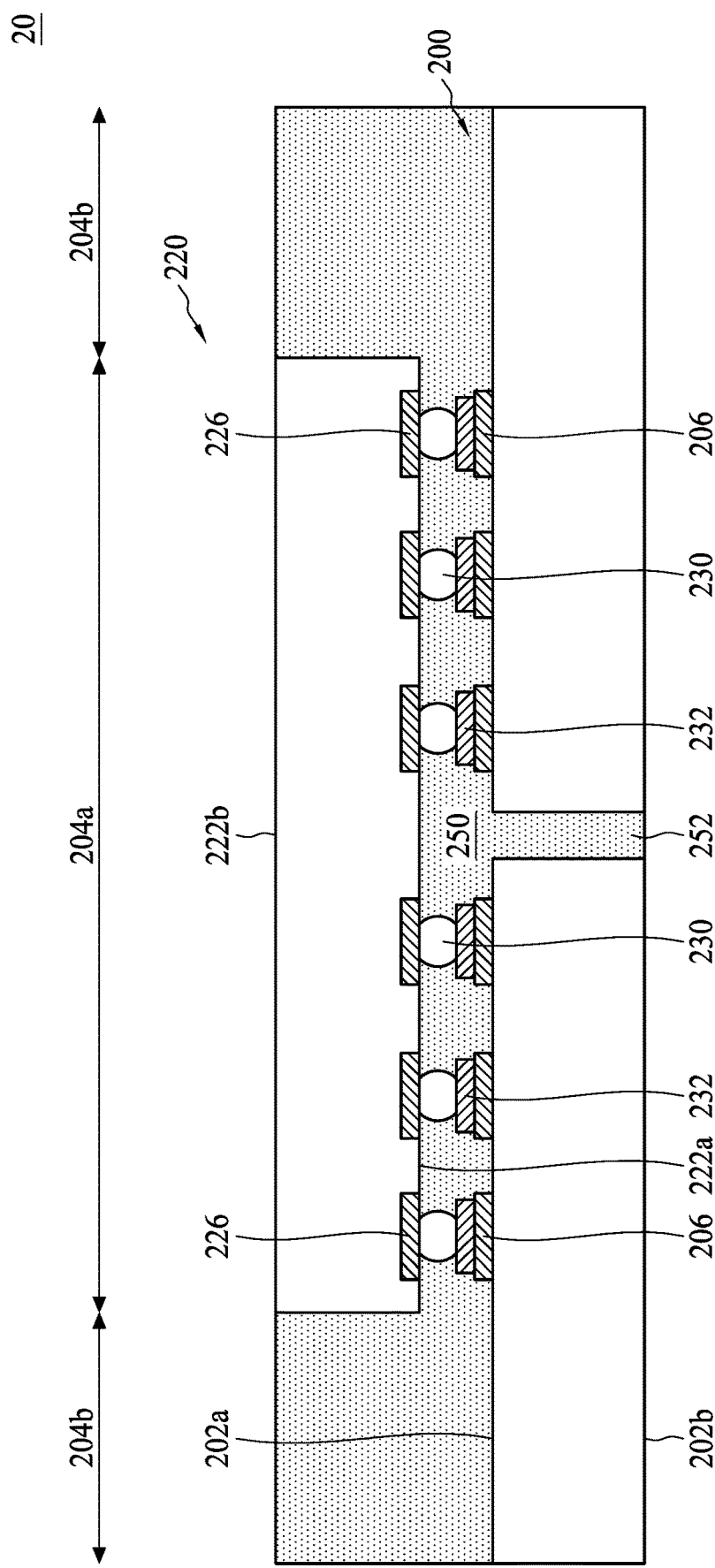
FIG. 7 is a schematic drawing illustrating a semiconductor package structure according to aspects of one or more embodiments of the present disclosure.

Referring to FIG. 7, in some embodiments, the underfill 250 can be applied not only to the space 234 between the first package 200, the second package 220 and each of the connectors 230, but also to the space surrounding the second package 220. In those embodiments, the underfill 250 further can be referred to as a molding compound, but the disclosure is not limited thereto. Additionally, the second surface 222b of the second package 220 can be exposed through the underfill (or the molding compound) 250, but the disclosure is not limited thereto.

Figure 8:
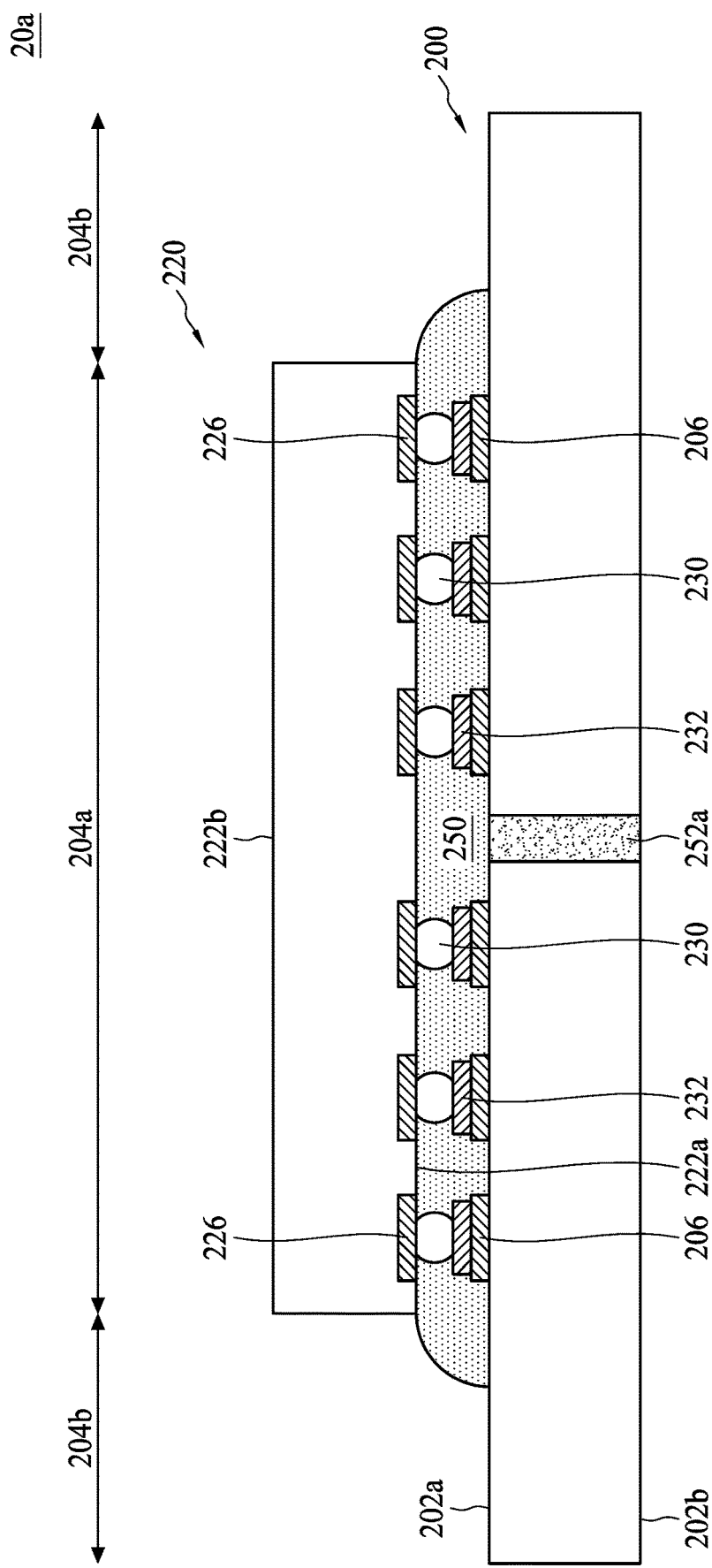
FIG. 8 is a schematic drawing illustrating a semiconductor package structure according to aspects of one or more embodiments of the present disclosure.

FIG. 8 is a schematic drawing illustrating a semiconductor package structure 20a according to aspects of one or more embodiments of the present disclosure. It should be noted that similar elements in FIG. 6 and FIG. 8 are designated by the same numerals. Further, similar elements in FIG. 6 and FIG. 8 can include similar materials and can be formed by similar steps; therefore, such redundant details are omitted in the interest of brevity, and only the differences are mentioned. In some embodiments, the difference between the semiconductor package structure 20 and the semiconductor package structure 20a is that the insulating structure 252a and the underfill 250 can include different materials. However, the insulating structure 252a is still exposed through the first surface 202a and the second surface 202b, and is coupled to the underfill 250, as shown in FIG. 8.

Referring back to FIG. 6, accordingly, a semiconductor package structure 20 is provided. The semiconductor package structure 20 includes the first package 200, the insulating structure 252, the second package 220, and the plurality of connectors 230. As shown in FIG. 6, the first package 200 includes the first surface 202a and the second surface 202b. In some embodiments, the first surface 202a can be an active surface, as mentioned above, but the disclosure is not limited thereto. The first package 200 can include the bonding region 204a, where the second package 220 is to be accommodated and bonded, and the periphery region 204b. In some embodiments, the periphery region 204b surrounds the bonding region 204a as mentioned above, but the disclosure is not limited thereto. The insulating structure 252 is disposed in the bonding region 204a of the first package 200, and the second package 220 is disposed over the first package 200 and the insulating structure 252 in the bonding region 204a. The second package 220 can include the first surface 222a and the second surface 222b opposite to the first surface 222a. In some embodiments, the first surface 222a can be an active surface as mentioned above, but the disclosure is not limited thereto. In some embodiments, the first surface 222a of the second package 220 faces the first surface 202a of the first package 200, but the disclosure is not limited thereto. As shown in FIG. 6, the insulating structure 252 penetrates the first package 200 and through the first surface 202a and the second surface 202b of the first package 200. In other words, a height of the insulating structure 252 is substantially equal to a thickness of the first package 200, but the disclosure is not limited thereto. The first package 200 further includes the plurality of first bonding pads 206 disposed over the first surface 202a in the bonding region 204a, and the second package 220 further includes the plurality of second bonding pads 226 disposed over the first surface 222a. The connectors 230 are disposed between the first bonding pads 206 of the first package 200 and the second bonding pads 226 of the second package 220. The connectors 230 provide both the mechanical and electrical connections between the first package 200 and the second package 220 by bonding the first bonding pads 206 to the second bonding pads 226.

Still referring to FIG. 6, the semiconductor package structure 20 further includes the underfill 250 between the first package 200, the second package 220, and each of the connectors 230. In some embodiments, the insulating structure 252 and the underfill 250 include a same material, and the insulating structure 252 is coupled to the underfill 250. As mentioned above, the insulating structure 252 includes a circular shape or a radiating pattern from a top view, but the disclosure is not limited thereto. Notably, the insulating structure 252 is spaced apart from the first bonding pads 206, as shown in FIG. 6.

According to the semiconductor package structure 20 provided by one or more embodiments of the present disclosure, the flux residue is reduced by performing the flux removal operation through the previously existing through-hole 210. As a result, the applied underfill 250 can have better contact with the surfaces of the first package 200, the second package 220, and the connectors 230. Accordingly, the underfill delamination and void issues are mitigated. Further, since the through-hole 210 is filled by the underfill 250, the first package 200 maintains sufficient mechanical strength to support the second package 220. Accordingly, both performance and reliability of the semiconductor package structure 20 are improved.

Figure 9:
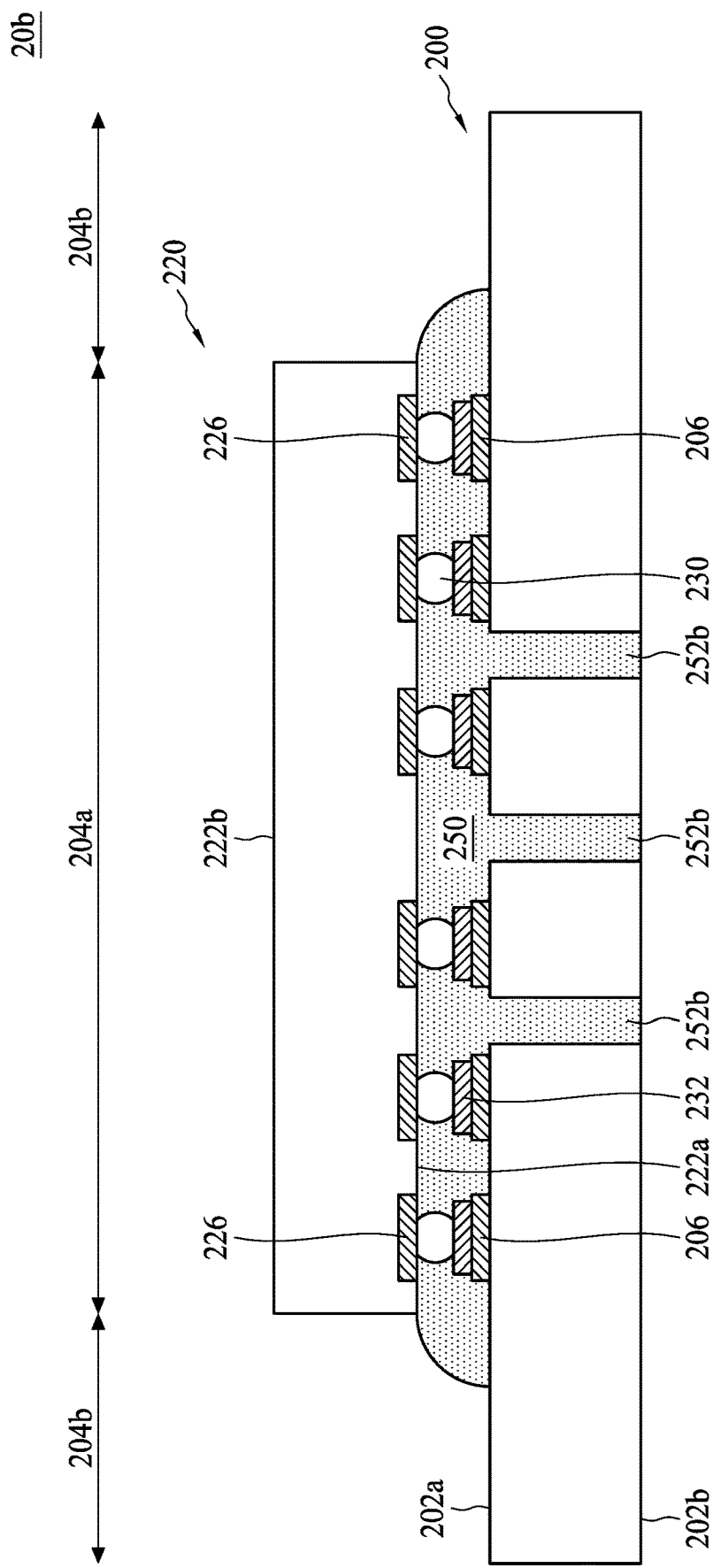
FIG. 9 is a schematic drawing illustrating a semiconductor package structure according to aspects of one or more embodiments of the present disclosure.

FIG. 9 is a schematic drawing illustrating a semiconductor package structure 20b according to aspects of one or more embodiments of the present disclosure. It should be noted that similar elements in FIG. 6 and FIG. 9 are designated by the same numerals. Further, similar elements in FIG. 6 and FIG. 9 can include similar materials and can be formed by similar steps; therefore, such redundant details are omitted in the interest of brevity, and only the differences are mentioned. In some embodiments, the difference between the semiconductor package structure 20 and the semiconductor package structure 20b is that the semiconductor package structure 20b includes a plurality of insulating structures 252b disposed in the bonding region 204a of the first package 200. As shown in FIG. 9, the first insulating structures 252b penetrate the first package 200, and thus each of the first insulating structures 252b is exposed through the first surface 202a and the second surface 202b. Further, the first insulating structures 252b are spaced apart from the connectors 230 and the first bonding pads 206. The insulating structures 252b are coupled to the underfill 250, as shown in FIG. 9. In some embodiments, the first insulating structures 252b can include materials that are the same as those of the underfill 250, but the disclosure is not limited thereto.

The first insulating structures 252b are formed in what were previously a plurality of through-holes (not shown) located in the bonding region 204a of the first package 200. The cleaning agent (not shown) is provided to the second surface 202b to directly flush superfluous flux away through the through-holes in the bonding region 204a. Notably, the plurality of through-holes further increase efficiency of the flux removal. It should be noted that even if the bump pitch of the connectors 230 is reduced to less than 180 µm, the superfluous flux can be efficiently removed because the cleaning agent is directly injected into the space through the many through-holes, instead of slowly flowing into the space by capillarity. Additionally, in some embodiments, in which a size of the second package 220 is larger than 20 mm by 30 mm, the superfluous flux can still be efficiently removed because the cleaning agent is directly injected into the space through the many through-holes.

The insulating structure 252b is subsequently formed by filling the through-holes in the bonding region 204a with insulating materials such as the underfill 250 after the flux removal operation. Notably, the insulating structure 252b in the first package 200 helps to maintain sufficient mechanical strength to support the second package 220. Accordingly, both performance and reliability of the semiconductor package structure 20b are improved.

Figure 10:
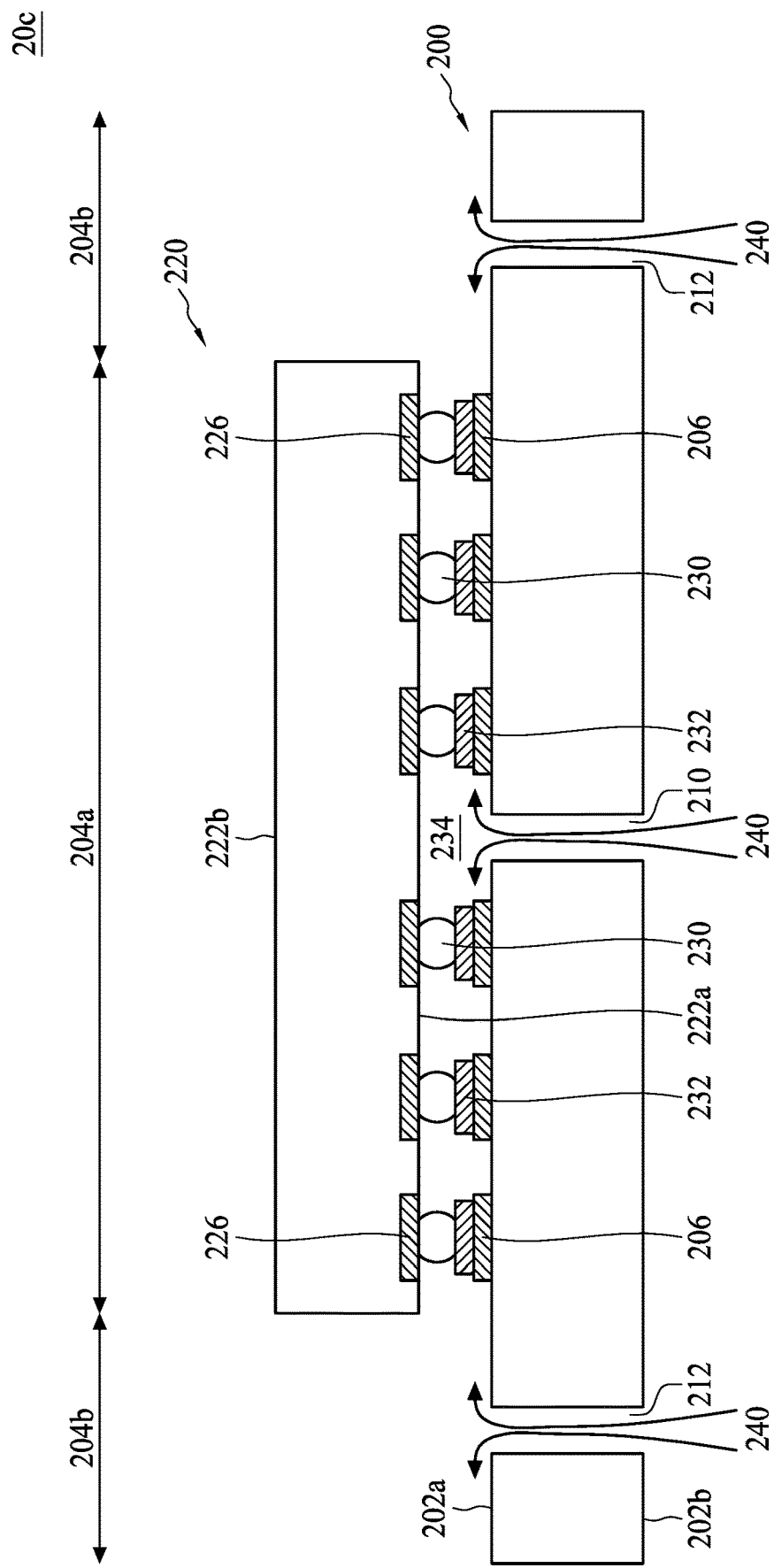
FIGS. 10 and 11 are schematic drawings illustrating a semiconductor package structure at various fabrication stages constructed according to aspects of one or more embodiments of the present disclosure.
Figure 11:
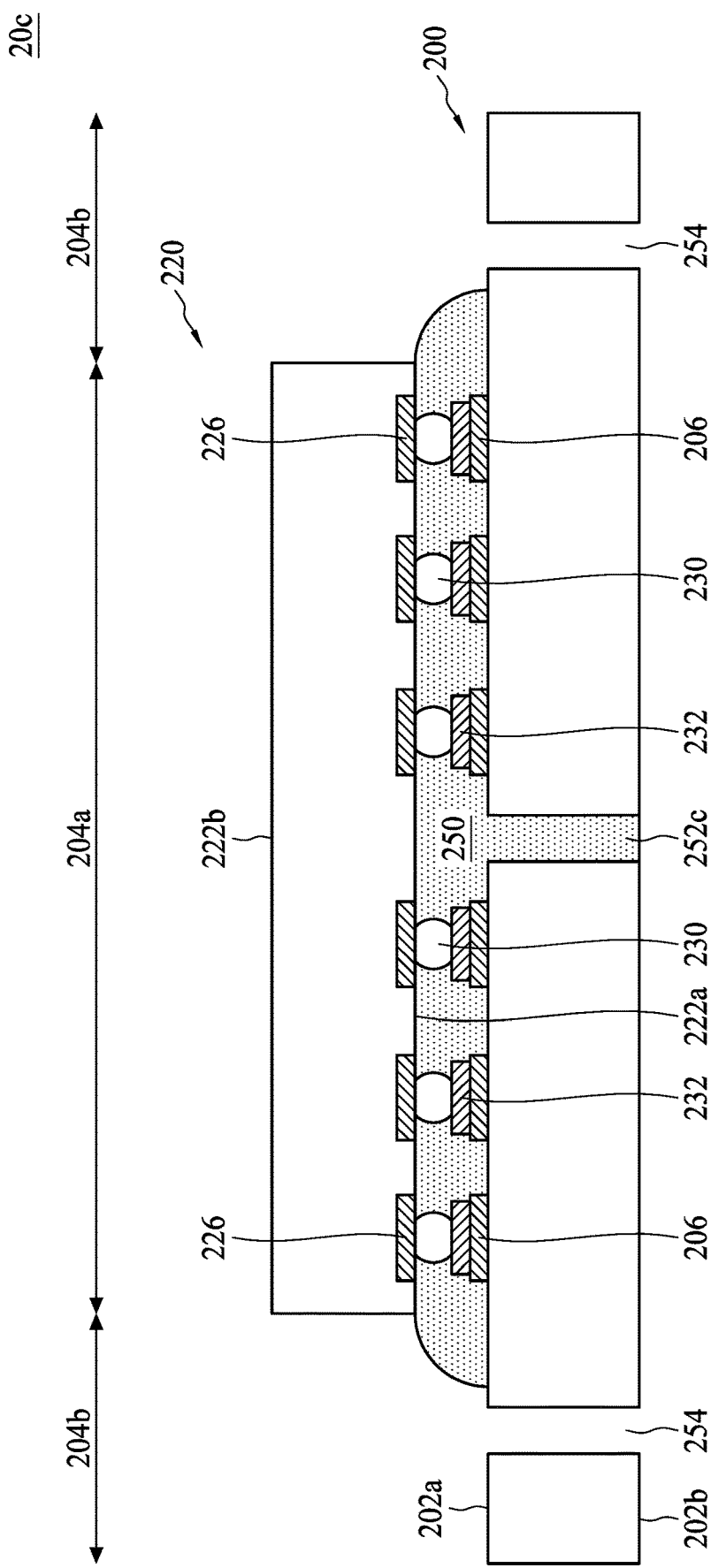

FIGS. 10 and 11 are schematic drawings illustrating a semiconductor package structure 20c at various fabrication stages constructed according to aspects of one or more embodiments of the present disclosure. It should be noted that similar elements in FIGS. 2 to 6 and FIGS. 10 to 11 are designated by the same numerals. Further, similar elements in FIGS. 2 to 6 and FIGS. 10 to 11 can include similar materials and can be formed by similar steps; therefore, such redundant details are omitted in the interest of brevity. In some embodiments, a first package 200 is provided according to operation 102. The first package 200 includes a first surface 202a and a second surface 202b opposite to the first surface 202a. The first package 200 can include a bonding region 204a and a periphery region 204b surrounding the bonding region 204a. Further, the first package 200 can include at least a first through-hole 210 in the bonding region 204a and at least a second through-hole 212 in the periphery region 204b. In addition, the first through-hole 210 formed in the bonding region 204a is spaced apart from a plurality of first bonding pads 206.

After the first package 200 is bonded to a second package 220 by a plurality of connectors 230 disposed between the first package 200 and the second package 220 according to operation 104, at least a cleaning agent 240 is provided to the second surface 202b of the first package 200 according to operation 106. The cleaning agent 240 is pressurized and injected into a space 234 between the first surface 202a of the first package 200, the first surface 222a of the second package 220, and the connectors 230 through the through-holes 210 and 212. Consequently, the cleaning agent 240 directly flushes superfluous flux away. Notably, the through-holes 210 and 212 further increase efficiency of the flux removal. It should be noted that even if the hump pitch of the connectors 230 is reduced to less than 180 the superfluous flux can be efficiently removed because the cleaning agent 240 is directly injected into the space 234 through the many through-holes 210 and 212, instead of slowly flowing into the space 234 by capillarity. Additionally, in some embodiments, in which a size of the second package 220 is larger than 20 mm by 30 mm, the superfluous flux can still be efficiently removed because the cleaning agent 240 is directly injected into the space 234 through the many through-holes 210 and 212, instead of slowly flowing into the space 234 by capillarity.

Referring to FIG. 11, the insulating structure 252c is subsequently formed by filling the first through-hole 210 in the bonding region 204a with insulating materials such as the under ill 250 after the flux removal operation, while the second through-holes 212 in the periphery region 204b are left unfilled. Thus, the insulating structure 252c is formed in the bonding region 204a and spaced apart from the first bonding pads 206, while the second through-holes 212 in the periphery region 204b are left unfilled and area therefore referred to as air gaps 254. Notably, the insulating structure 252c in the first package 200 helps to maintain sufficient mechanical strength to support the second package 220, while the air gaps 254 help to buffer thermal stress generated in the first package 200 during thermal cycling and thus further reduce warpage. Accordingly, both performance and reliability of the semiconductor package structure 20c are improved.

Figure 12:
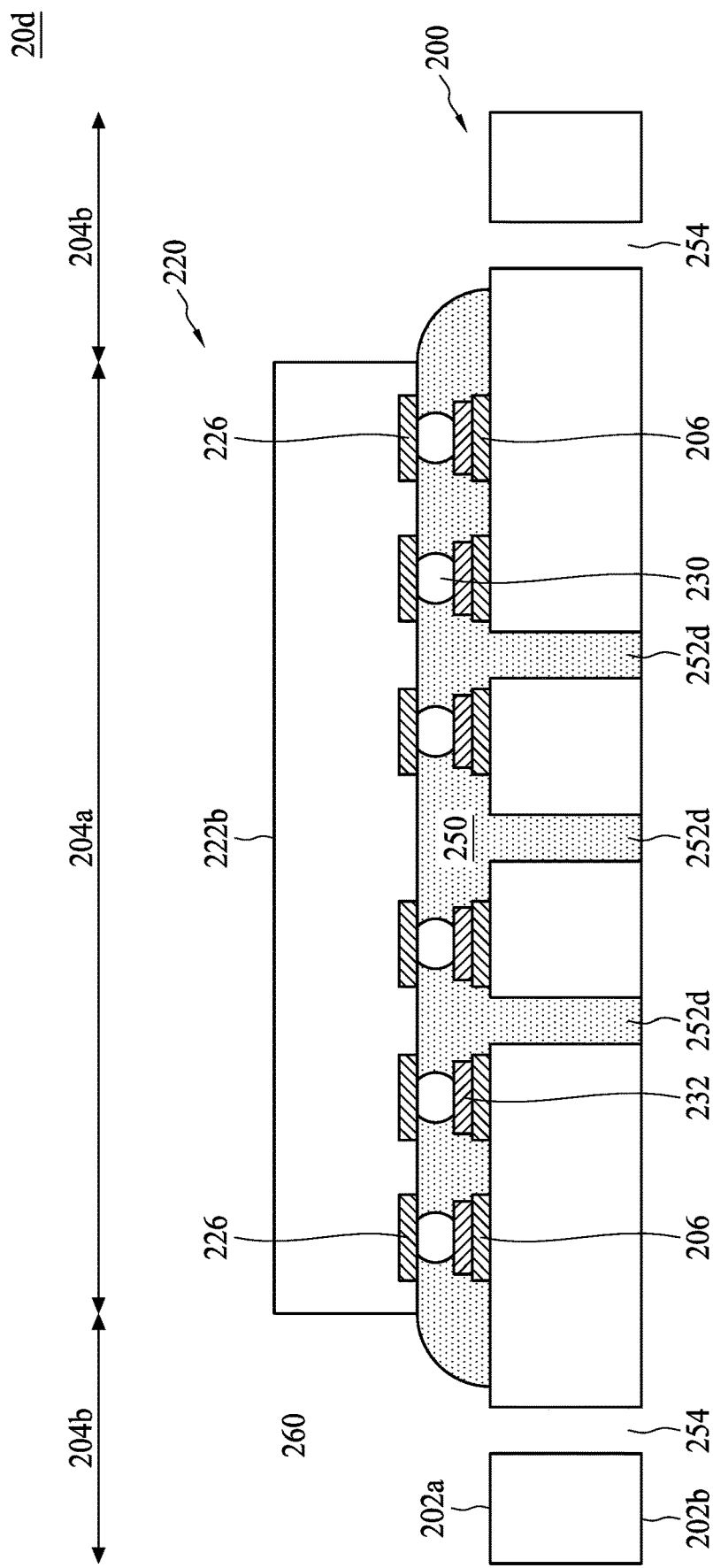
FIG. 12 is a schematic drawing illustrating another semiconductor package structure according to aspects of one or more embodiments of the present disclosure.
Figure 14:
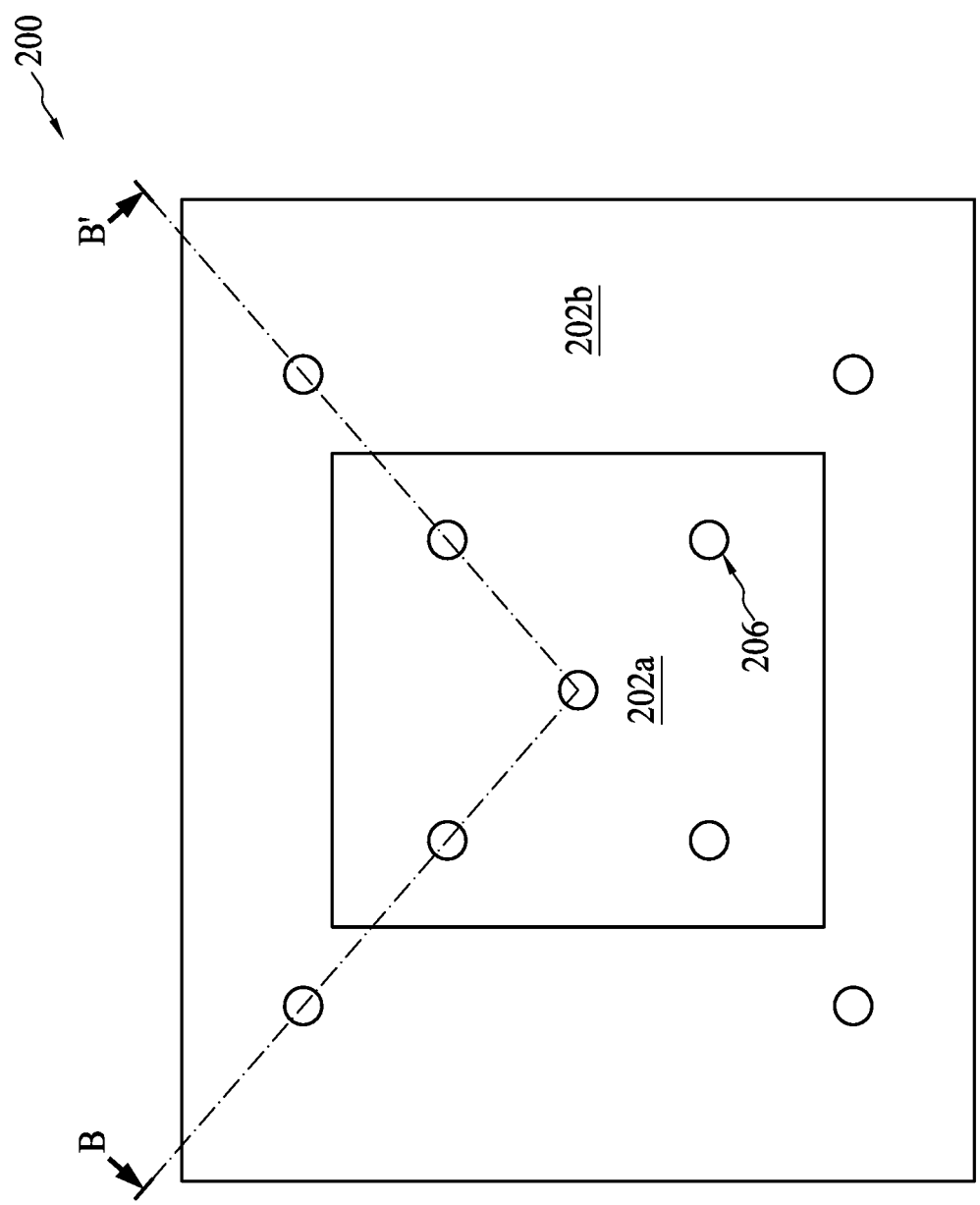
FIG. 14 is a schematic top view of the first package of the semiconductor package structure according to aspects of one or more embodiments of the present disclosure.

FIG. 12 is a schematic drawing illustrating a semiconductor package structure 20d according to aspects of one or more embodiments of the present disclosure. Further, FIG. 12 can be a cross-sectional view taken along line B-B of FIG. 14. It should be noted that similar elements in FIG. 6 and FIG. 12 are designated by the same numerals. Further, similar elements in FIG. 6 and FIG. 12 can include similar materials and can be formed by similar steps; therefore, such redundant details are omitted in the interest of brevity, and only the differences are mentioned. In some embodiments, the difference between the semiconductor package structure 20 and the semiconductor package structure 20d is that the semiconductor package structure 20d includes a plurality of first insulating structures 252d disposed in the bonding region 204a of the first package 200 and a plurality of second insulating structures 254 disposed in the periphery region 204b of the first package 200. As shown in FIG. 12, both of the first insulating structures 252d and the second insulating structures 254 penetrate the first package 200. Further, the first insulating structures 252d are spaced apart from the plurality of connectors 230 and the plurality of first bonding pads 206.

In some embodiments, the first insulating structures 252d can include materials that are the same as those of the underfill 250, but the disclosure is not limited thereto. Each first insulating structure 252d is exposed through the first surface 202a and the second surface 202b, and is coupled to the underfill 250, as shown in FIG. 12. In some embodiments, the second insulating structures 254 include air, and the second insulating structures 254 can therefore be referred to as air gaps.

As mentioned above, the first insulating structures 252c and the second insulating structures 254 are formed in what were previously a plurality of through-holes (not shown) located in the bonding region 204a and the periphery region 204b of the first package 200. The cleaning agent (not shown) is provided to the second surface 202h to directly flush superfluous flux away through the through-holes in both of the bonding region 204a and the periphery region 204b. Notably, the through-holes thither increase efficiency of the flux removal. It is worth noting that even if the bump pitch of the plurality of connectors 230 is reduced to less than 180 μm, and/or if a size of the second package 220 is larger than 20 mm by 30 mm, the superfluous flux can be efficiently removed because the cleaning agent is directly injected into the space through the many through-holes, instead of slowly flowing into the space by capillarity.

The insulating structure 252d is subsequently formed by filling the through-holes in the bonding region 204a with insulating materials such as the underfill 250 after the flux removal operation, while the through-holes in the periphery region 204b are left unfilled. Notably, the insulating structure 252d in the first package 200 helps to maintain sufficient mechanical strength to support the second package 220, while the second insulating structures (i.e., the air gaps) 254 help to buffer thermal stress generated in the first package 200 during thermal cycling and thus further reduce warpage. Accordingly, both performance and reliability of the semiconductor package structure 20d are improved.

Figure 13:
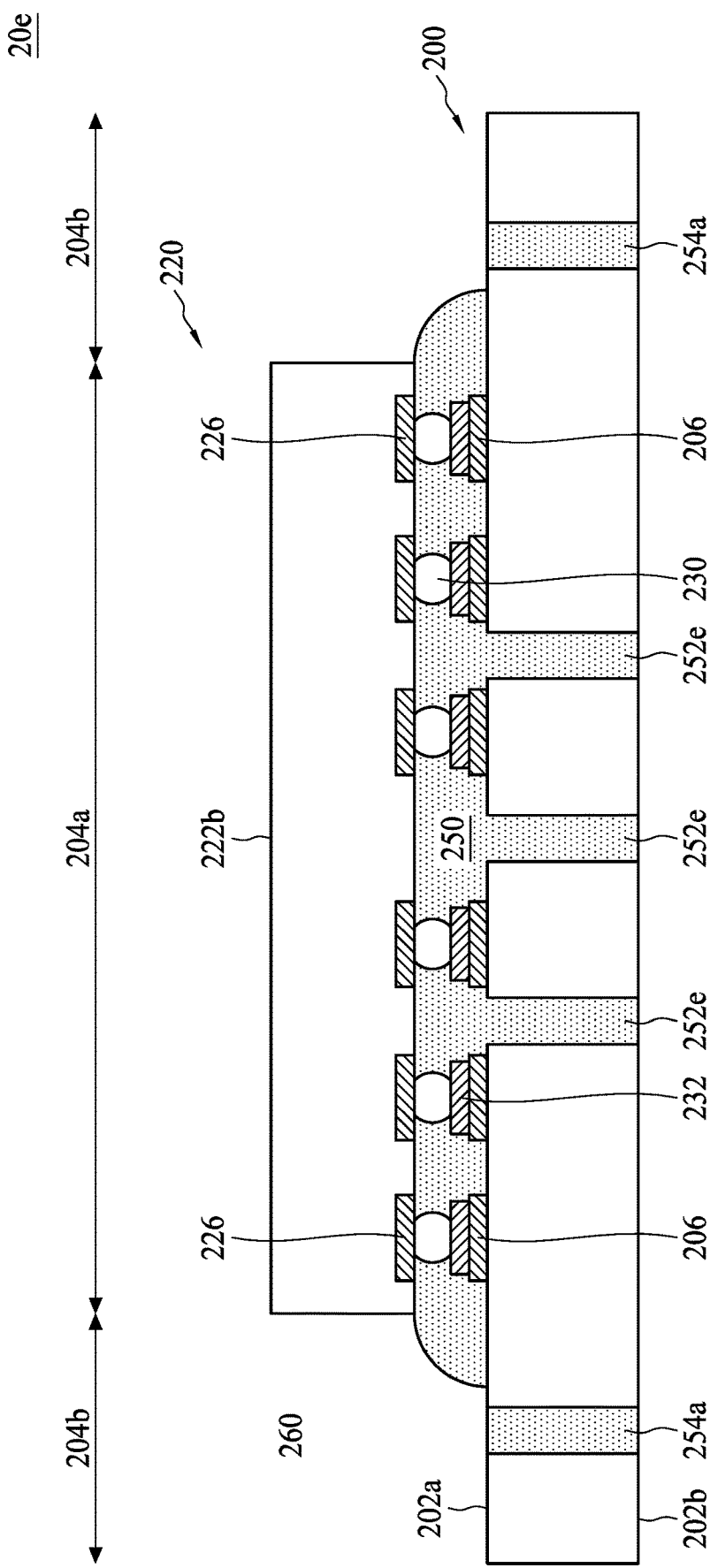
FIG. 13 is a schematic drawing illustrating another semiconductor package structure according to aspects of one or more embodiments of the present disclosure.

FIG. 13 is a schematic drawing illustrating a semiconductor package structure 20e according to aspects of one or more embodiments of the present disclosure. FIG. 13 can be a cross-sectional view taken along line B-B of FIG. 14. It should be noted that similar elements in FIG. 6 and FIG. 13 are designated by the same numerals. Further, similar elements in FIG. 6 and FIG. 13 can include similar materials and can be formed by similar steps; therefore, such redundant details are omitted in the interest of brevity, and only the differences are mentioned. In some embodiments, the difference between the semiconductor package structure 20 and the semiconductor package structure 20e is that the semiconductor package structure 20e includes a plurality of first insulating structures 252e disposed in the bonding region 204a of the first package 200 and a plurality of second insulating structures 254a disposed in the periphery region 204b of the first package 200. As shown in FIG. 13, both of the first insulating structures 252e and the second insulating structures 254a penetrate the first package 200. Further, the first insulating structures 252e are spaced apart from the connectors 230 and the first bonding pads 206.

In some embodiments, the first insulating structures 252e can include materials that are the same as those of the underfill 250, but the disclosure is not limited thereto. In some embodiments, the first insulating structures 252e and the second insulating structures 254a can include a same material, but the disclosure it not limited thereto. Each first insulating structure 252e is exposed through the first surface 202a and the second surface 202b, and is coupled to the underfill 250, as shown in FIG. 13. Each second insulating structure 254a is exposed through the first surface 202a and the second surface 202b. In some embodiments, the second insulating structures 254a are spaced apart from the underfill 250, as shown in FIG. 13. However in other embodiments, the second insulating structures 254 can be coupled to the underfill 250, though not shown.

As mentioned above, the first insulating structures 252e and the second insulating structures 254a are formed in what were previously a plurality of through-holes (not shown) located in the bonding region 204a and the periphery region 204b of the first package 200. The cleaning agent (not shown) is provided to the second surface 202b to directly flush superfluous flux away through the through-holes in both of the bonding region 204a and the periphery region 204b. Notably, the through-holes further increase efficiency of the flux removal. It should be noted that even if the bump pitch of the plurality of connectors 230 is reduced to less than 180 μm, and/or if a size of the second package 220 is larger than 20 mm by 30 mm, the superfluous flux can be efficiently removed because the cleaning agent is directly injected into the space through the many through-holes, instead of slowly flowing into the space by capillarity.

The first insulating structures 252e and the second insulating structures 254a are subsequently formed by filling the through-holes with insulating materials such as the underfill 250 after the flux removal operation. Notably, the insulating structures 252e in the first package 200 help to maintain sufficient mechanical strength to support the second package 220. Accordingly, both performance and reliability of the semiconductor package structure 20e are improved. Additionally, the method and the through-holes can be used in 3DIC, package-on package (PoP), and lead-free package.

The present disclosure provides a semiconductor structure including a package having at least one through-hole that allowing cleaning solvent, to be directly injected into the space between the bonded structures. Therefore, flux removal efficiency may be improved and flux residue is reduced. Further, the through-hole can mitigate package warpage. After the flux removal operation, the underfill is applied to the space between the bonded structures to form the insulating structures. Accordingly, underfill delamination, underfill void, bump bridge and cold joint issues are all mitigated while the mechanical strength of the package is maintained.

In some embodiments, a semiconductor package structure is provided. The semiconductor package structure includes a first package including a bonding region and a periphery region surrounding the bonding region, at least one insulating structure disposed in the bonding region of the first package, a second package disposed over the first package and the insulating structure in the bonding region, and a plurality of connectors disposed between the first package and the second package. The plurality of connectors provide electrical connection between the first package and the second package. Further, the insulating structure penetrates the first package and is spaced apart from the plurality of connectors.

In some embodiments, a semiconductor package structure is provided. The semiconductor package structure includes a first package including a bonding region and a periphery region surrounding the bonding region, a plurality of first insulating structures disposed in the bonding region of the first package, a plurality of second insulating structures disposed in the periphery region of the first package, a second package disposed over the first package and the plurality of first insulating structures in the bonding region, and a plurality of connectors disposed between the first package and the second package. The plurality of connectors provide electrical connection between the first package and the second package. Further, the plurality of first insulating structures and the plurality of second insulating structures penetrate the first package. The plurality of first insulating structures are spaced apart from the plurality of connectors.

In some embodiments, a method for manufacturing a semiconductor package structure is provided. The method includes the following operations. A first package is provided. The first package includes a first surface, a second surface opposite to the first surface, and at least a first through-hole penetrating the first package from the first surface to the second surface. The first surface of the first package is bonded to a second package by a plurality of connectors disposed between the first package and the second package. At least a cleaning agent is then provided to the second surface of the first package. The cleaning agent is injected into a space between the first package, the second package and each of the plurality of connectors through the first through-hole.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package structure comprising:
   a first package comprising a bonding region and a periphery region surrounding the bonding region;
   at least one insulating structure disposed in the bonding region of the first package;
   a second package disposed over the first package and the insulating structure in the bonding region;
   a plurality of connectors disposed between the first package and the second package in the bonding region, and providing electrical connection between the first package and the second package; and
   an underfill between the first package, the second package, and each of the plurality of connectors,
   wherein the insulating structure penetrates the first package and is spaced apart from the plurality of connectors, the insulating structure and the underfill comprise different materials, the insulting structure is coupled to the underfill to form an interface between the underfill and the insulating structure, and the interface is aligned with a top surface of the first substrate.

2. The semiconductor package structure of claim 1, wherein the first package further comprises a plurality of bonding pads disposed in the bonding region and electrically connected to the plurality of connectors.

3. The semiconductor package structure of claim 2, wherein the insulating structure is spaced apart from the plurality of bonding pads.

4. The semiconductor package structure of claim 2, further comprising a solder flux on each of the plurality of bonding pads.

5. The semiconductor package structure of claim 4, wherein the underfill is in contact with the solder fluxes.

6. The semiconductor package structure of claim 1, wherein the insulating structure includes a circular shape or a radiating pattern from a top view.

7. The semiconductor package structure of claim 1, further comprising at least one air gap disposed in the periphery region of the first package.

8. A semiconductor package structure comprising:
   a first package comprising a bonding region and a periphery region surrounding the bonding region;
   a plurality of first insulating structures disposed in the bonding region of the first package;
   a plurality of second insulating structures disposed in the periphery region of the first package;
   a second package disposed over the first package and the plurality of first insulating structures in the bonding region;
   a plurality of connectors disposed between the first package and the second package in the bonding region, and electrically coupling the first package and the second package; and
   an underfill between the first package, the second package, and each of the plurality of connectors,
   wherein the plurality of first insulating structures and the plurality of second insulating structures penetrate the first package, the plurality of first insulating structures are spaced apart from the plurality of connectors, and the plurality first insulating structure, the plurality of second insulating structures and the underfill comprise a same material.

9. The semiconductor package structure of claim 8, wherein the first package further comprises a plurality of bonding pads disposed in the bonding region and electrically connected to the plurality of connectors.

10. The semiconductor package structure of claim 9, further comprising a solder flux on each of the plurality of bonding pads.

11. The semiconductor package structure of claim 10, wherein the underfill is in contact with the solder fluxes.

12. A semiconductor package structure comprising:
    a first package comprising a bonding region and a periphery region surrounding the bonding region;
    at least a first insulating structure disposed in the bonding region of the first package;
    a second package disposed over the first package and the first insulating structure in the bonding region;
    a plurality of connectors disposed between the first package and the second package in the bonding region, and providing electrical connections between the first package and the second package; and
    an underfill between the first package, the second package, and each of the plurality of connectors,
    wherein the first insulating structure penetrates the first package and is spaced apart from the plurality of connectors, the first insulating structure and the underfill are coupled to each other, and sidewalls of the second package are covered by the underfill.

13. The semiconductor package structure of claim 12, wherein the first insulating structure and the underfill include a same material.

14. The semiconductor package structure of claim 12, wherein the first insulating structure and the underfill include different materials.

15. The semiconductor package structure of claim 12, further comprising at least a second insulating structure disposed in the periphery region.

16. The semiconductor package structure of claim 15, wherein the first insulating structure, the second insulating structure and the underfill include a same material.

17. The semiconductor package structure of claim 15, wherein the second insulating structure comprises a material different from that of the first insulating structure and the underfill.

18. The semiconductor package structure of claim 12, wherein the first package further comprises a plurality of bonding pads disposed in the bonding region and electrically connected to the plurality of connectors.

19. The semiconductor package structure of claim 18, further comprising a solder flux on each of the plurality of bonding pads.

20. The semiconductor package structure of claim 19, wherein the underfill is in contact with the solder fluxes.

* * * * *